US012689161B2

(12) United States Patent　(10) Patent No.:　US 12,689,161 B2
Champion et al.　(45) Date of Patent:　Jul. 21, 2026

(54) STRIPLINE WAFER FOR WAFER BASED CONNECTOR SYSTEM

(71) Applicant: TE Connectivity Solutions GmbH, Schaffhausen (CH)

(72) Inventors: Bruce Allen Champion, Camp Hill, PA (US); Charles Raymond Gingrich, III, Mechanicsburg, PA (US); Keith Edwin Miller, Manheim, PA (US); Michael Frank Cina, Elizabethtown, PA (US); Scott Eric Walton, Mount Joy, PA (US); Joshua Allen Rosenau, York, PA (US)

(73) Assignee: TE Connectivity Solutions GmbH (CH)

( * ) Notice: Subject to any disclaimer, the term of this patent is extended or adjusted under 35 U.S.C. 154(b) by 200 days.

(21) Appl. No.: 18/589,470

(22) Filed: Feb. 28, 2024

(65) Prior Publication Data

US 2024/0313480 A1　Sep. 19, 2024

Related U.S. Application Data

(60) Provisional application No. 63/490,014, filed on Mar. 14, 2023.

(51) Int. Cl.
　H01R 12/71　　(2011.01)
　H01R 12/72　　(2011.01)
　　　(Continued)
(52) U.S. Cl.
　CPC ....... H01R 13/6587 (2013.01); H01R 12/716 (2013.01); H01R 12/721 (2013.01);
　　　(Continued)

(58) Field of Classification Search
　CPC .. H01R 12/585; H01R 12/716; H01R 12/721; H01R 12/724; H01R 12/71;
　　　(Continued)

(56) References Cited

U.S. PATENT DOCUMENTS 5,423,691 A　6/1995　Pickles
6,171,115 B1　1/2001　Mickievicz et al.
　　　(Continued)

FOREIGN PATENT DOCUMENTS

CN　102214865 A　10/2011
CN　102340067 A　2/2012
　　　(Continued)

OTHER PUBLICATIONS

Difference Between Microstrip and Stripline_Sierra Ckts_pp. 1-35_ Feb. 2021.*
　　　(Continued)

*Primary Examiner* — Timothy J Thompson
*Assistant Examiner* — Guillermo J Egoavil

(57) ABSTRACT

A multilayer stripline wafer for use in an electrical connector. The multilayer stripline wafer includes multiple layers. Signal transmission pathways are positioned on at least one internal layer of the multiple layers. The signal transmission pathways may be uncoupled or loosely coupled singe ended single ended signal transmission pathways or differentially coupled signal transmission pathways. Conductive planar members are positioned in one or more layers of the multiple layers. The conductive planar members are spaced from the signal transmission pathways. One or more conductive planar members controls the impedance of the signal transmission pathways.

16 Claims, 8 Drawing Sheets

(51) Int. Cl.

| | |
|---|---|
| *H01R 13/193* | (2006.01) |
| *H01R 13/26* | (2006.01) |
| *H01R 13/6471* | (2011.01) |
| *H01R 13/6585* | (2011.01) |
| *H01R 13/6587* | (2011.01) |
| *H05K 1/02* | (2006.01) |

(52) U.S. Cl.
CPC ......... *H01R 12/724* (2013.01); *H01R 13/193* (2013.01); *H01R 13/26* (2013.01); *H01R 13/6471* (2013.01); *H01R 13/6585* (2013.01); *H05K 1/0251* (2013.01)

(58) Field of Classification Search
CPC .............. H01R 13/193; H01R 13/2457; H01R 13/2492; H01R 13/26; H01R 13/6471; H01R 13/6585; H01R 13/6587; H05K 1/0251; H05K 1/02
USPC ........................................................ 174/260
See application file for complete search history.

(56) References Cited

U.S. PATENT DOCUMENTS

| | | | |
|---|---|---|---|
| 6,245,166 | B1 | 6/2001 | Shibuya et al. |
| 6,267,604 | B1 | 7/2001 | Mickievicz et al. |
| 6,824,391 | B2 | 11/2004 | Mickievicz et al. |
| 7,175,445 | B2 | 2/2007 | Consoli et al. |
| 7,909,648 | B2 | 3/2011 | Tai |
| 9,590,340 | B2 | 3/2017 | Blumenschein et al. |
| 2006/0121781 | A1 | 6/2006 | Zhang et al. |
| 2013/0014979 | A1 | 1/2013 | Uzoh et al. |
| 2013/0059471 | A1 | 3/2013 | Mongold et al. |
| 2014/0113490 | A1 | 4/2014 | Simmel et al. |
| 2015/0228706 | A1 | 8/2015 | Lee |
| 2017/0018881 | A1 | 1/2017 | Patel et al. |
| 2019/0052006 | A1* | 2/2019 | Liu ...................... H01R 12/724 |
| 2019/0162768 | A1 | 5/2019 | Chandra |
| 2019/0173214 | A1 | 6/2019 | Leidner et al. |
| 2020/0296822 | A1 | 9/2020 | Choi et al. |

FOREIGN PATENT DOCUMENTS

| | | |
|---|---|---|
| EP | 3293836 A1 | 3/2018 |
| JP | S55125073 U | 9/1980 |
| WO | 02/063682 A2 | 8/2002 |
| WO | 2005015692 A1 | 2/2005 |
| WO | 2008001459 A1 | 1/2008 |
| WO | 2010011753 A1 | 1/2010 |

OTHER PUBLICATIONS

PCB Design Techniques_Montrose_pp. 1 to 340 _IEEE Press 2000.*

Stripline vs Microstrip_ PCB Routing _ Altium Agile_pp. 1-6_Oct. 2020.*

What is Via Stitching & Why is it Useful_pcbtrace_pp. 1-3_ Jul. 2021.*

International Search Report, International App. No PCT/IB2024/052490 International Filing Date Mar. 14, 2024.

International Search Report, International App. No PCT/IB2024/052491 International Filing Date Mar. 14, 2024.

International Search Report, International App. No PCT/182024/052490 International Filing Date Mar. 14, 2024.

* cited by examiner

STRIPLINE WAFER FOR WAFER BASED CONNECTOR SYSTEM

FIELD OF THE INVENTION

The invention relates generally to electrical connectors and connector systems. In particular, the invention is directed to a wafer based electrical connector with stripline based wafers.

BACKGROUND OF THE INVENTION

Electrical connectors for interconnecting a circuit board backplane to a daughterboard generally comprise two mating connector halves. One of the mating halves commonly includes a plurality of wafers or circuit boards which include signal carrying traces and ground traces. These connectors have a high contact density and are required to operate at relatively high electrical speeds. Due to continuing trends toward miniaturization and improved electrical performance by the electronics industry, requirements for greater contact density and higher electrical speeds are constantly being promulgated. These requirements lead to design conflicts, due to the fact that increasing the contact density places the traces and contacts in closer proximity to each other, thereby leading to signal integrity issues between the traces and contacts.

It would, therefore, be beneficial to provide an electrical connector with stripline wafers which can provide better current capacity and a number of signal integrity benefits, such as, but not limited to, better skew, impedance, and shielding performance.

SUMMARY OF THE INVENTION

The following provides a summary of certain illustrative embodiments of the present invention. This summary is not an extensive overview and is not intended to identify key or critical aspects or elements of the present invention or to delineate its scope.

The connector system includes one or more multi-layer stripline wafers which provide a number of signal integrity benefits. The signal integrity benefits include, but are not limited to, better skew, impedance, and shielding performance. The one or more multi-layer stripline wafers of the connector also provide increased current capacity for power wafer applications. In addition the one or more multi-layer stripline wafers are typically thicker than known wafers, providing mechanical benefits to the electrical connector.

An embodiment is directed to a multilayer stripline wafer for use in an electrical connector. The multilayer stripline wafer includes multiple layers. Single ended signal transmission pathways are positioned on at least one internal layer of the multiple layers. The single ended signal transmission pathways are spaced apart to remain uncoupled. Conductive planar members are positioned in one or more layers of the multiple layers, The conductive planar members are spaced from the single ended signal transmission pathways. One or more of the internal conductive planar members controls the impedance of the single ended signal transmission pathways.

An embodiment is directed to a multilayer stripline wafer for use in an electrical connector. The multilayer stripline wafer includes multiple layers. Differentially coupled signal transmission pathways are positioned on at least one internal layer of the multiple layers. Conductive planar members are positioned in one or more layers of the multiple layers. The conductive planar members are spaced from the differentially coupled signal transmission pathways. One or more conductive planar members controls the impedance of the differentially coupled signal transmission pathways.

An embodiment is directed to a multilayer stripline wafer for use in an electrical connector. The multilayer stripline wafer includes multiple layers of conductive material which are spaced apart. The multiple layers of conductive material are configured to allow for high current transmission across the multilayer stripline wafer.

Additional features and aspects of the present invention will become apparent to those of ordinary skill in the art upon reading and understanding the following detailed description of the exemplary embodiments. As will be appreciated by the skilled artisan, further embodiments of the invention are possible without departing from the scope and spirit of the invention. Accordingly, the drawings and associated descriptions are to be regarded as illustrative and not restrictive in nature

Figure 1:
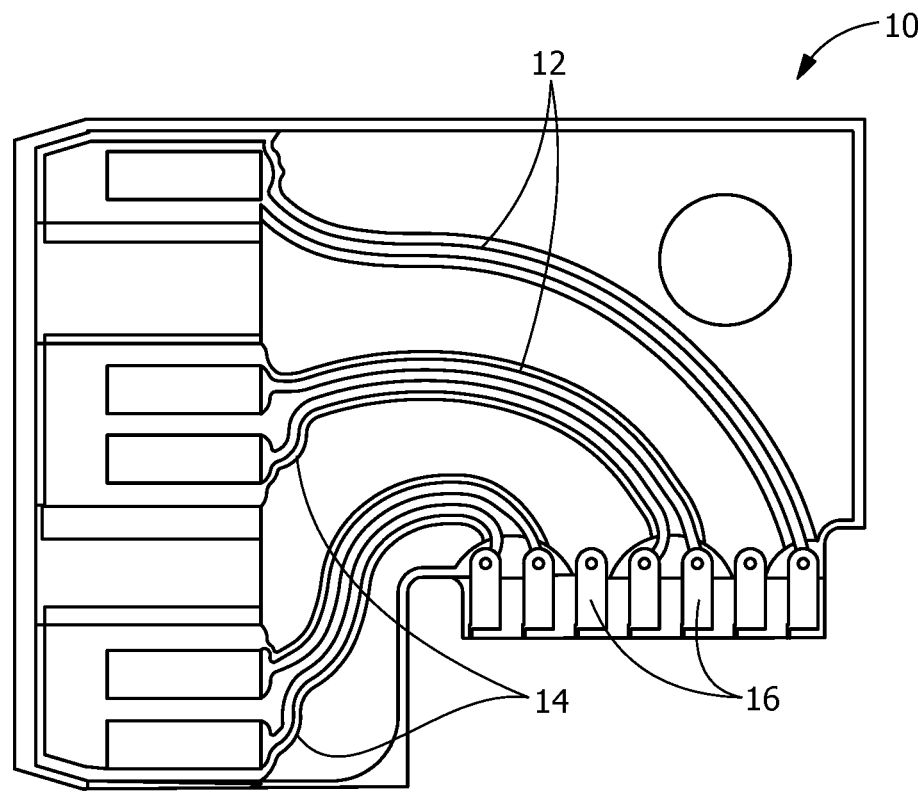
FIG. 1 is a top view of an illustrative circuit board or wafer according the prior art, the wafer has grounded coplanar waveguide transmission lines.

The accompanying drawings, which are incorporated into and form a part of the specification, schematically illustrate one or more exemplary embodiments of the invention and, together with the general description given above and detailed description given below, serve to explain the principles of the invention.

DETAILED DESCRIPTION OF THE INVENTION

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the preferred embodiments. Accordingly, the invention expressly should not be limited to such preferred embodiments illustrating some possible non-limiting combination of features that may exist alone or in other combinations of features, the scope of the invention being defined by the claims appended hereto.

Exemplary embodiments of the present invention are now described with reference to the Figures. Reference numerals are used throughout the detailed description to refer to the various elements and structures. Although the following detailed description contains many specifics for the purposes of illustration, a person of ordinary skill in the art will appreciate that many variations and alterations to the following details are within the scope of the invention. Accordingly, the following embodiments of the invention are set forth without any loss of generality to, and without imposing limitations upon, the claimed invention.

Figure 2:
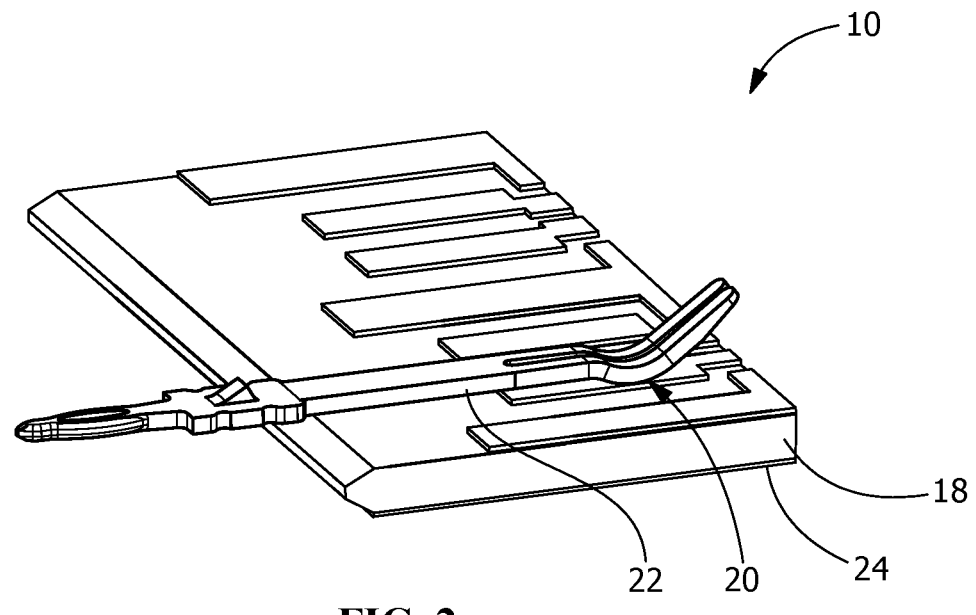
FIG. 2 is a perspective view of an illustrative circuit board or wafer according the prior art.
Figure 3:
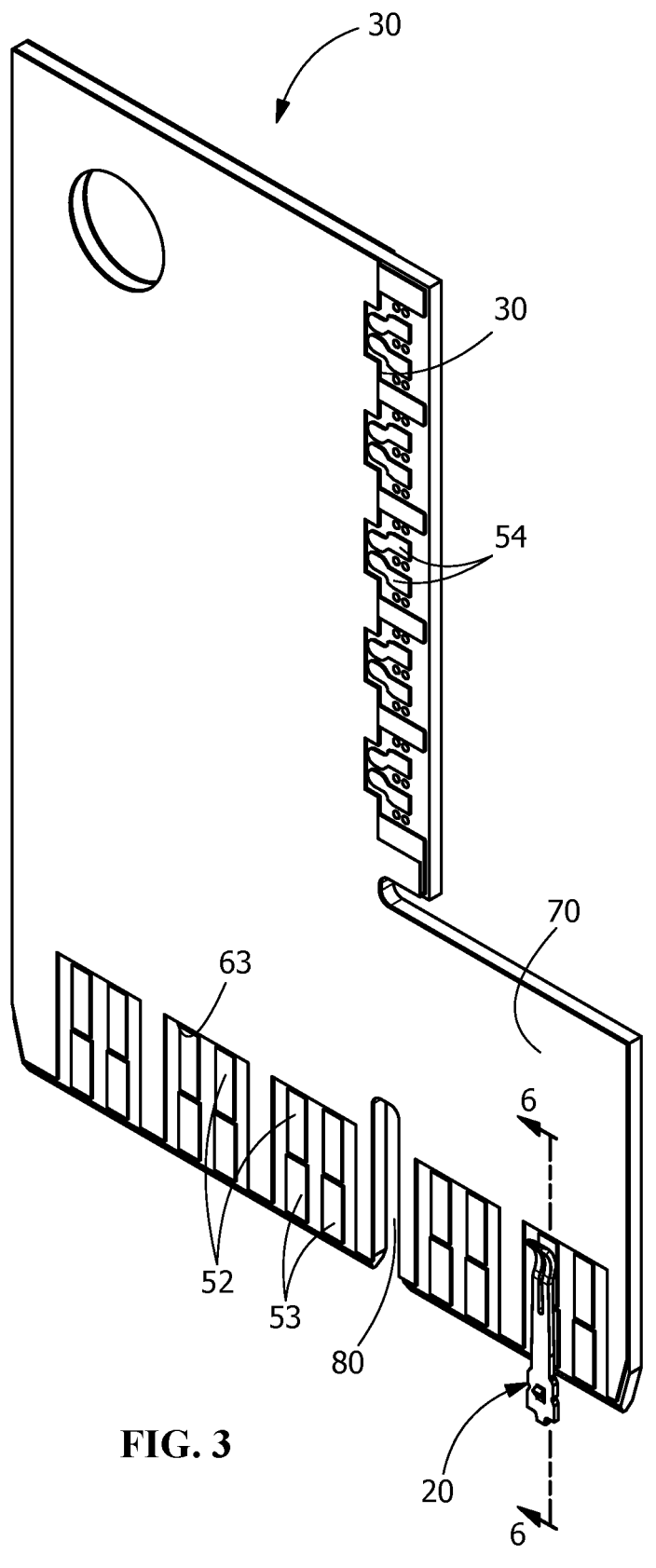
FIG. 3 is a perspective view of an illustrative embodiment of a multilayer circuit board or wafer according to the present invention.
Figure 4:
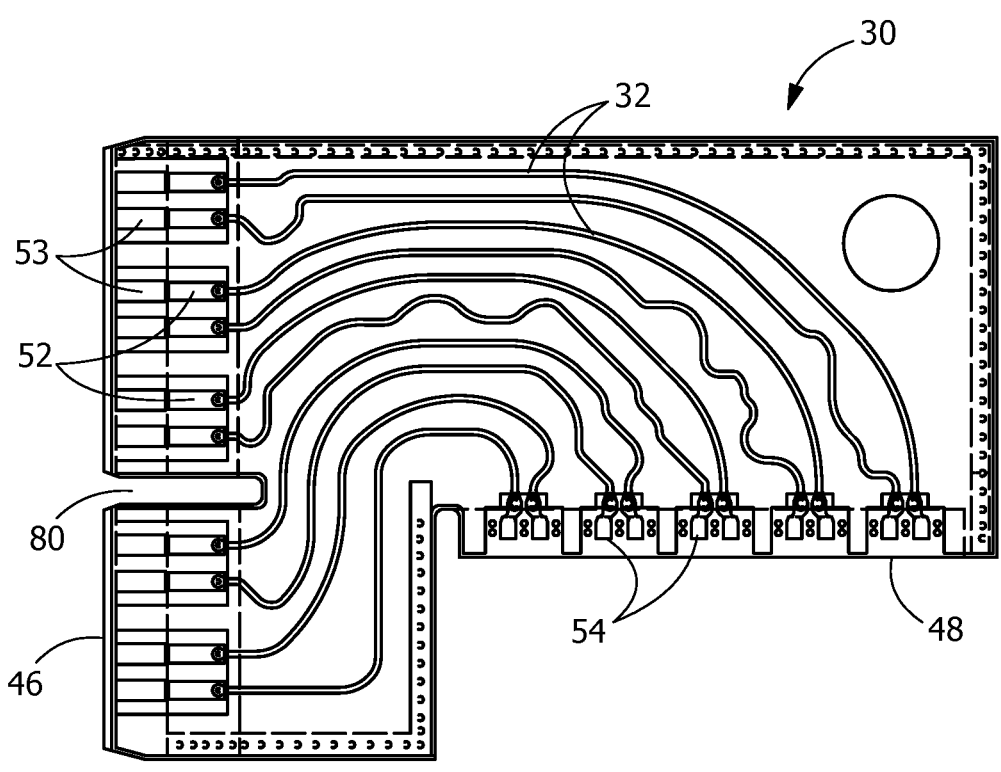
FIG. 4 is a view of an illustrative embodiment of a representative layer of the multilayer circuit board or wafer of FIG. 3.
Figure 5:
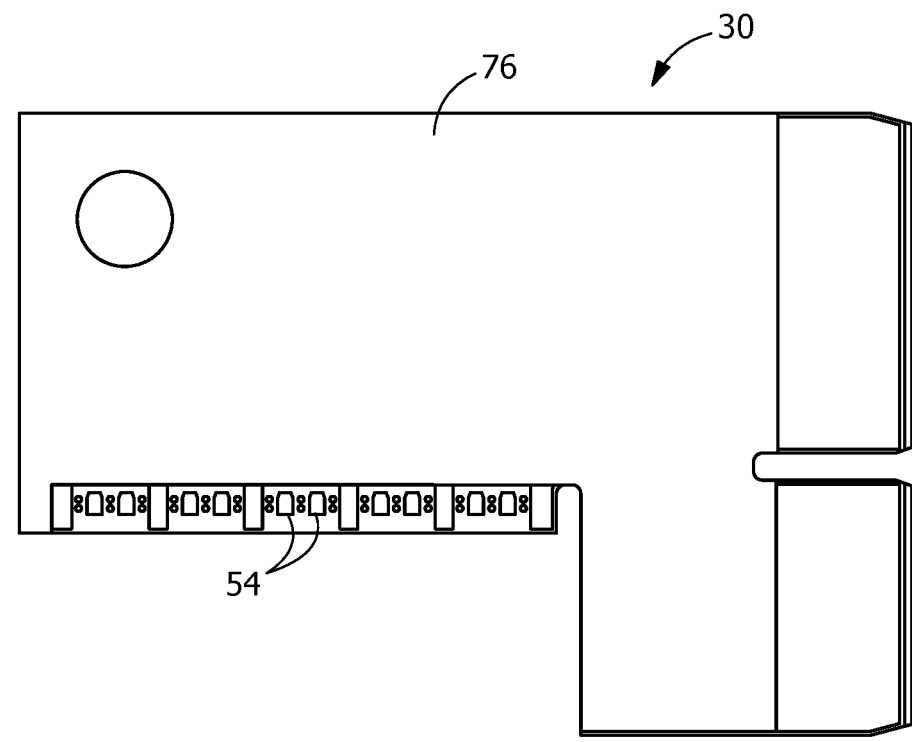
FIG. 5 is a view of another illustrative layer of a representative layer of the multilayer circuit board or wafer of FIG. 3.

Known wafer based connector systems 10 use grounded coplanar waveguide signal transmission lines, traces or pathways 12, as shown in FIG. 1. The wafer based connector systems 10 use skew compensation techniques that lengthen the trace 14 close to the pincer and/or mating regions 16. These are complex, cumbersome to design, and difficult to tune from an impedance perspective. Also, in known systems, as illustrated in FIG. 2, the grounded coplanar waveguide transmission lines, traces or pathways 12 is constructed on a two layer wafer 18. Typically, the impedance in the beam area 22 of a two layer wafer-based connector system 10 is high, which is undesirable. The impedance of the beam area 22 is high because, on a two layer wafer 18, the beam area 22 of a mating signal contacts 20 is positioned over a section of the wafter 18 which has no copper or ground layer provided therein. Consequently, the beam area 22 is far from the ground plane 24. To solve this, the thickness of the wafer 18 could be reduced; however, the wafer 18 cannot be too thin because of durability considerations.

In contrast, the illustrative multilayer stripline wafer 30 of the present invention, as shown in FIGS. 3-6 allows for signals to be routed single ended. However, the invention and the wafers are not limited to single ended routing. For example, the signals may be routed with differential signal transmission lines, traces or pathways.

The single ended signal transmission lines, traces or pathways 32 can be spaced apart such that they remain uncoupled or loosely coupled. When a signal transmission lines, traces or pathways 32 are uncoupled there is no mode conversion; thus, the signal transmission lines, traces or pathways 32 must only be length matched for skew compensation to be successful. The wafers 30 may be, but are not limited to, printed circuit boards that can be microstrip (two-layer), or stripline, with or without coplanar ground (three or more layers).

FIGS. 3-9 illustrate an electrical connector system 40 formed in accordance with an illustrative embodiment. The electrical connector system 40 includes a backplane connector 42 and a daughtercard connector 44 that are used to electrically connect a backplane circuit board (not shown) and a daughtercard circuit board (not shown). While the electrical connector system 40 is described herein with reference to backplane connectors 42 and daughtercard connectors 44, it is realized that the subject matter herein may be utilized with different types of electrical connectors other than a backplane connector or a daughtercard connector, such as, but not limited to, a mezzanine type connector system where the wafers are essentially an interposer. The backplane connector 42 and the daughtercard connector 44 are merely illustrative of an illustrative embodiment of an electrical connector system 40 that interconnects a particular type of circuit board, namely a backplane circuit board, with a daughtercard circuit board.

In the illustrative embodiment shown, the daughtercard connector 44 constitutes a right angle connector wherein a mating interface 46 and mounting interface 48 are oriented perpendicular to one another. The daughtercard connector 44 may be mounted to the daughtercard circuit board at the mounting interface 48 and mated to the backplane connector 42 at the mating interface 46. Other orientations of the interfaces 46, 48 are possible in alternative embodiments.

The daughtercard connector 44 includes a housing 50 holding a plurality of the stripline wafers 30. The housing 50 may be made from one or more components without departing from the scope of the invention.

Each of the stripline wafers 30 has individual signal transmission lines, traces or pathways 32 that extend between conductive pads 52 provided proximate the mating interface 46 and conductive pads 54 provided proximate the mounting interface 48, although the particular configuration of the individual signal transmission lines, traces or pathways 32 may vary from wafer 30 to wafer 30. The signal conductive pads 52 are configured to make an electrical connection to the signal transmission lines, traces or pathways 32 by known methods, such as, but not limited to vias or through holes. The signal conductive pads 52 are configured to be mated with and electrically connected to the signal contacts 20 of the backplane connector 42.

Floating pads 53 are provided proximate the mating interface 46. The floating pads 53 extend between the mating interface 46 and the conductive pads 52. The floating pads 53 do not physically engage the conductive pads 52. In the embodiment shown, the floating pads 53 are positioned proximate to, but spaced from a second internal ground layer 72 which are positioned in an adjacent layer of the wafer 30. However, in other embodiments, the floating pads 53 may be spaced further from any grounding members. In the embodiment shown, the close proximity of the floating pads 53 to the ground plane member 72. In the illustrative embodiment shown, the floating pads 53 are capacitively coupled to the second internal ground layer 72 and the beam area 22 of the contact 20. However, the floating pads 53 may be capacitively coupled to other layers.

Figure 6:
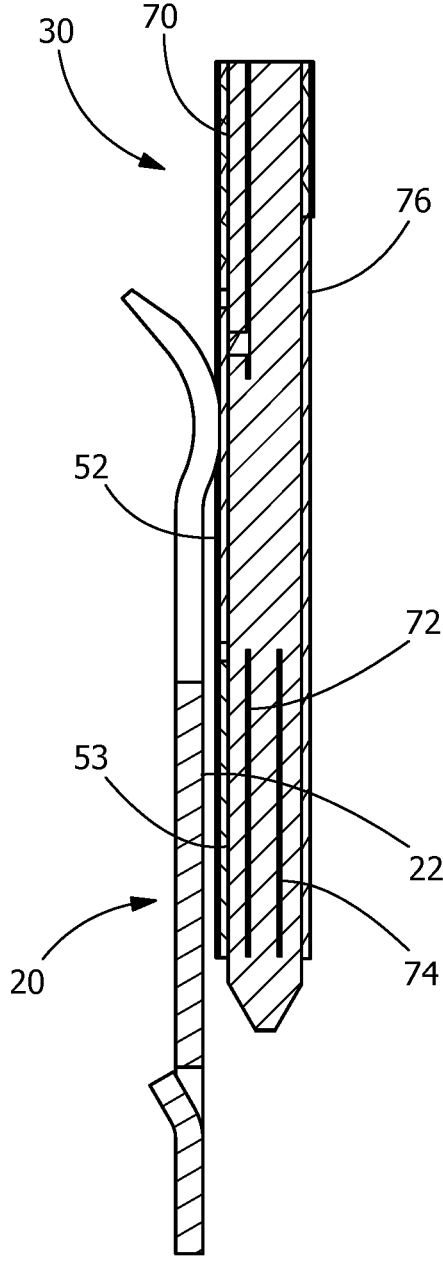
FIG. 6 is a cross-sectional view of the multilayer circuit board or wafer taken along line 6-6 of FIG. 3.
Figure 7:
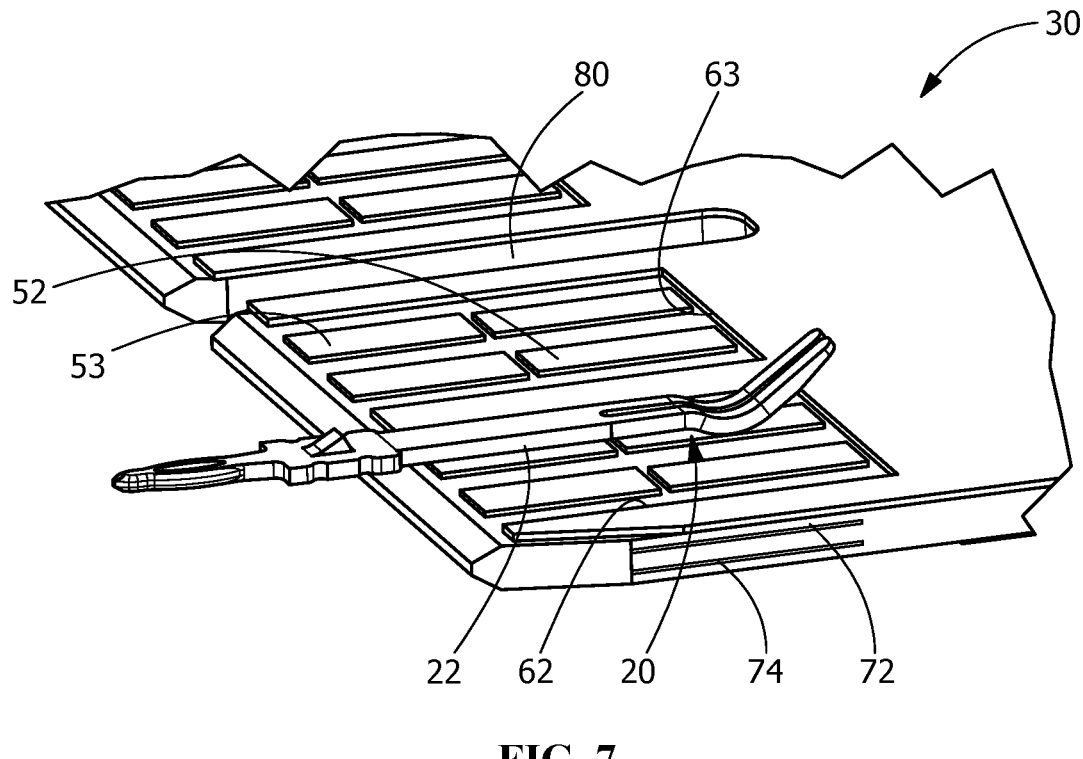
FIG. 7 is a partial perspective view of a mating area of the multilayer circuit board or wafer of FIG. 3.
Figure 8:
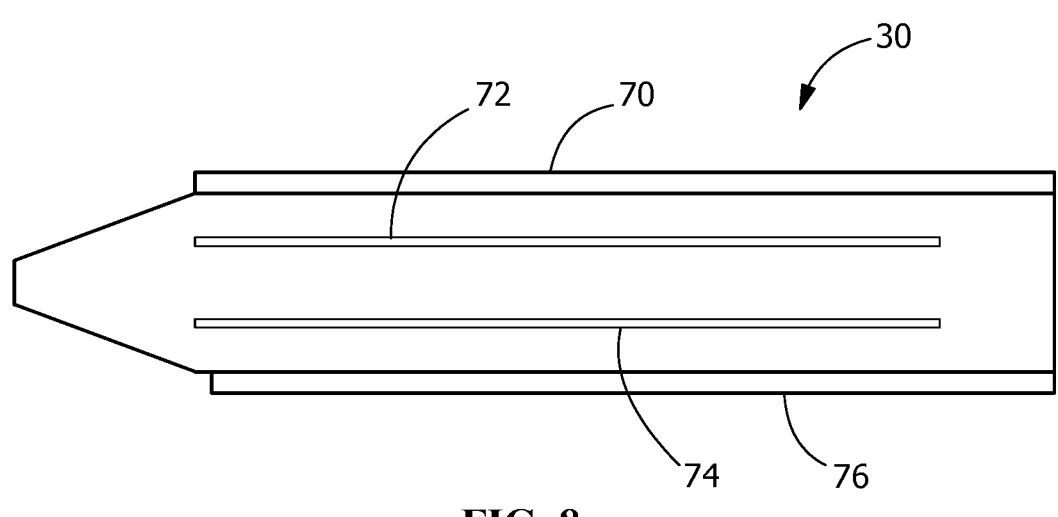
FIG. 8 is a side view of the multilayer circuit board or wafer of FIG. 3, illustrating the different layers.
Figure 13:
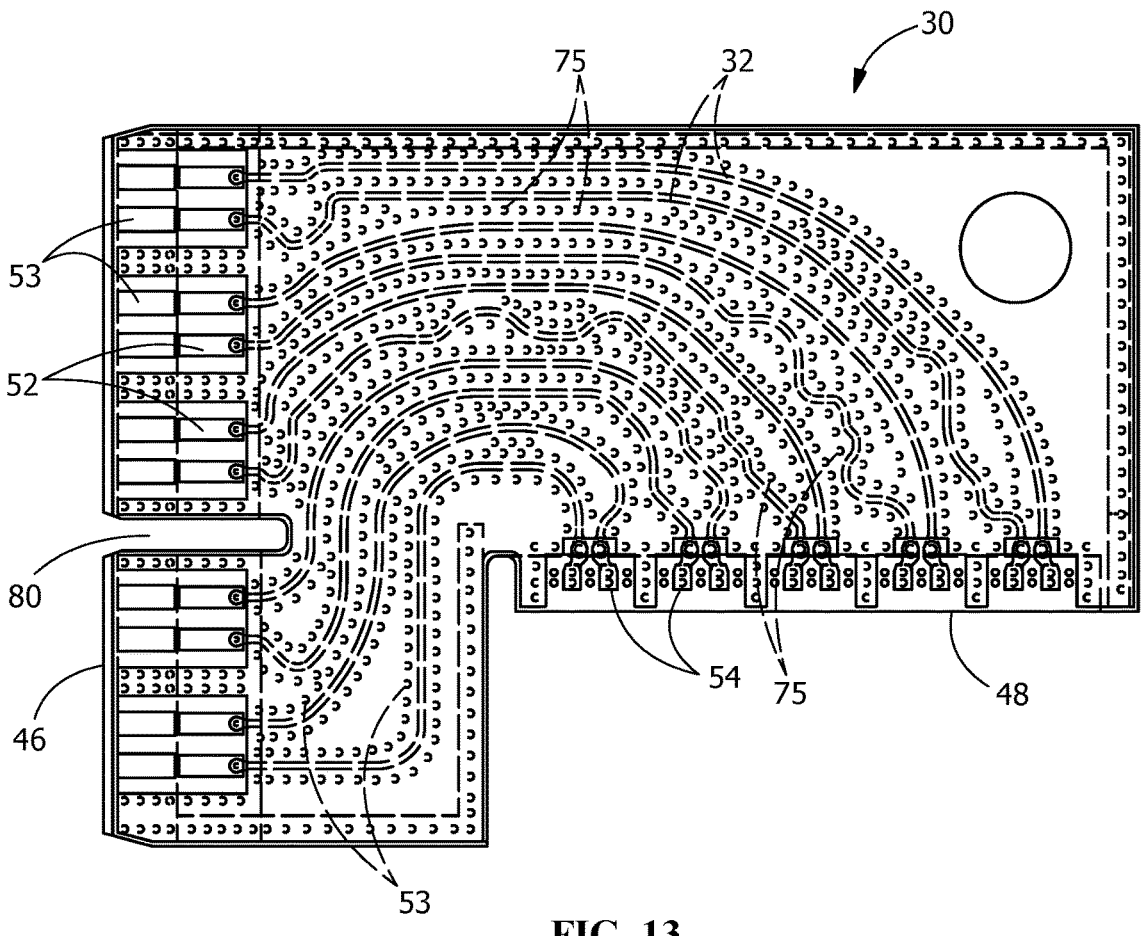
FIG. 13 is a view of an illustrative alternate embodiment of a representative layer of the multilayer circuit board or wafer with the layer above shown as translucent, the view illustrates vias which follow the trace routing of the representative layer.
Figure 14:
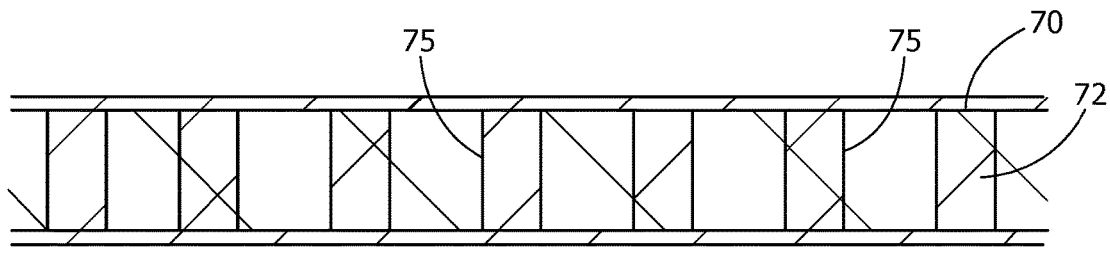
FIG. 14 is a cross-section view of the representative views of FIG. 13.

As shown in FIGS. 6 and 8, the illustrative wafer 30 has a first conductive layer 70, a second internal conductive layer 72, a third internal conductive layer 74 and a fourth conductive layer 76. In this embodiment, the first conductive layer 70 is a top ground layer. The fourth conductive layer 76 is a bottom ground layer. The second layer 72 includes the signal transmission lines, traces or pathways 32. The third conductive layer 74 includes some ground copper or paths. However, the purpose and use of each conductive layer may vary according to the particular configuration needed. For example, the signal transmission lines, traces or pathways 32 may be routed on the third internal conductive layer 74. As shown in FIGS. 13 and 14, stitched ground vias 75 may also be provided on the ground layers. The vias 75 follow the routing of the signal transmission lines, traces or pathways 32 to further facilitate noise reduction. Additionally, in various embodiments ground and power can be shared on any given layer. Although the embodiment illustrates four layers, any number of layers may be used.

Openings 62 are provided in the first layer 70 to expose the conductive pads 52 and the floating pads 53. An opening 63 (FIG. 3) is also provided to expose conductive pads 54. The fourth conductive ground plane layer 76 is positioned on the opposed side of the wafer 30. The ground layers 70 and 76 are configured to be mated with, and electrically connected to, ground contacts or ground plates of the backplane connector 42.

When used in a wafer configuration, the stripline signal transmission lines, traces or pathways 32, greatly reduces the complexity associated with skew compensation as compared to known wafer connectors. Instead of routing signals differentially coupled, as is done in the known art, the stripline wafers 30 allow for signals to be routed single ended over the stripline signal transmission lines, traces or pathways 32. The single ended stripline signal transmission lines, traces or pathways 32 can be spaced apart such that they remain uncoupled. As the stripline signal transmission lines, traces or pathways 32 are uncoupled, there is no mode conversion; thus, the stripline signal transmission lines, traces or pathways 32 must only be length matched for skew compensation to be successful.

The stripline wafers 30 also allow for an increased routing density. With a typical printed circuit board stack up, the stripline signal transmission lines, traces or pathways 32 can be significantly narrower as compared to the grounded coplanar waveguide while meeting the same impedance target. An increased routing density allows for a denser electrical connector system 40.

The stripline wafers 30 better allow printed circuit board manufacturers to consistently meet required impedance targets which will lead to fewer discarded printed circuit boards. In contrast, the grounded coplanar waveguide of the prior art is susceptible to under/over etching which can negatively impact impedance.

In the illustrative embodiment shown, the multilayer stripline wafer 30 has the second internal conductive planar member 72 and the third internal conductive planar member

74 positioned in the beam area 22. In this embodiment, the second internal conductive planar member 72 is a ground member. The second internal conductive planar member 72 is used as a reference and is capacitively coupled to the floating pads 53 in the beam areas 22 of the contacts 20 to allow the floating pads 53 to cooperate with the beams areas 22 to reduce the impedance of the beam areas 22. In one embodiment, the ground planar member 72 may be spaced approximately 0.004 inches from the floating pads 53.

The stripline wafers 30 of the present invention allow for finer control of the impedance in the signal transmission lines, traces or pathways 32. In a multilayer stripline wafer 30, as shown in FIGS. 6 and 8, the internal planar members 72, 74 can be used to reduce impedance in the signal transmission lines, traces or pathways 32, to minimize noise resonance, and improve connector performance.

In other embodiments, the internal conductive planar members 72, 74 may be positioned in other locations and may be used for different purposes, such as, but not limited to, multiple voltage planes.

The multilayer stripline wafer 30 has a higher volume of copper than known grounded coplanar waveguide. The increased volume of copper allows the multilayer stripline wafer 30 to be an effective heatsink. This allows for more current to flow across the wafer 30 while maintaining a temperature lower or equal to the grounded coplanar waveguide wafer.

Figures 11, 12:
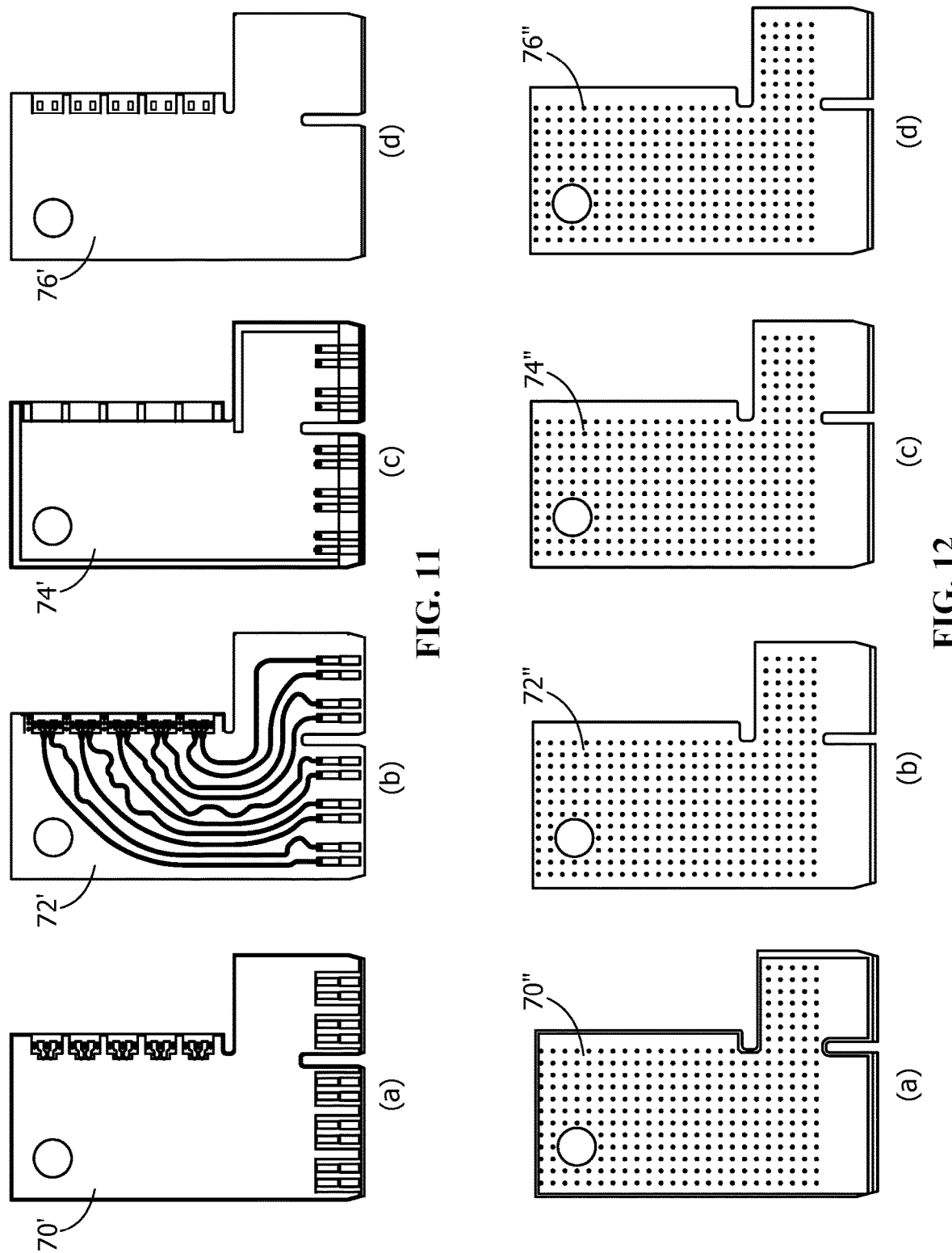
FIG. 11 is a diagrammatic view of first illustrative layers of a four layer circuit board or wafer configured to accommodate high-speed signal integrity, layers (a) and (d) are ground planes and layers (b) and (c) are routed layers.
FIG. 12 is a diagrammatic view of second illustrative layers of a four layer circuit board or wafer configured to accommodate high current/power, layers (a), (b), (c) and (d) are conductive plane layers.

While the illustrative embodiment shown in FIGS. 2-8 have been described in detail, the multilayer stripline wafer 30 can have various configurations. For example, the multilayer stripline wafer 30 can have top and bottom ground planes 70', 76' with routed layers 72', 74' positioned therebetween for high speed signal integrity, as shown in FIG. 11. Another example, shown in FIG. 12, shows the multilayer stripline wafer 30 having conductive plane layers, such as, but not limited to, copper plane layers, for all layers 70", 72", 74", 76" to accommodate high current/power transmission across the multilayer stripline wafer. In addition, as previously stated, the signal transmission lines, traces or pathways 32 in any of the layers can be single ended transmission lines, traces or pathways or coupled differential transmission lines, traces or pathways.

Figure 10:
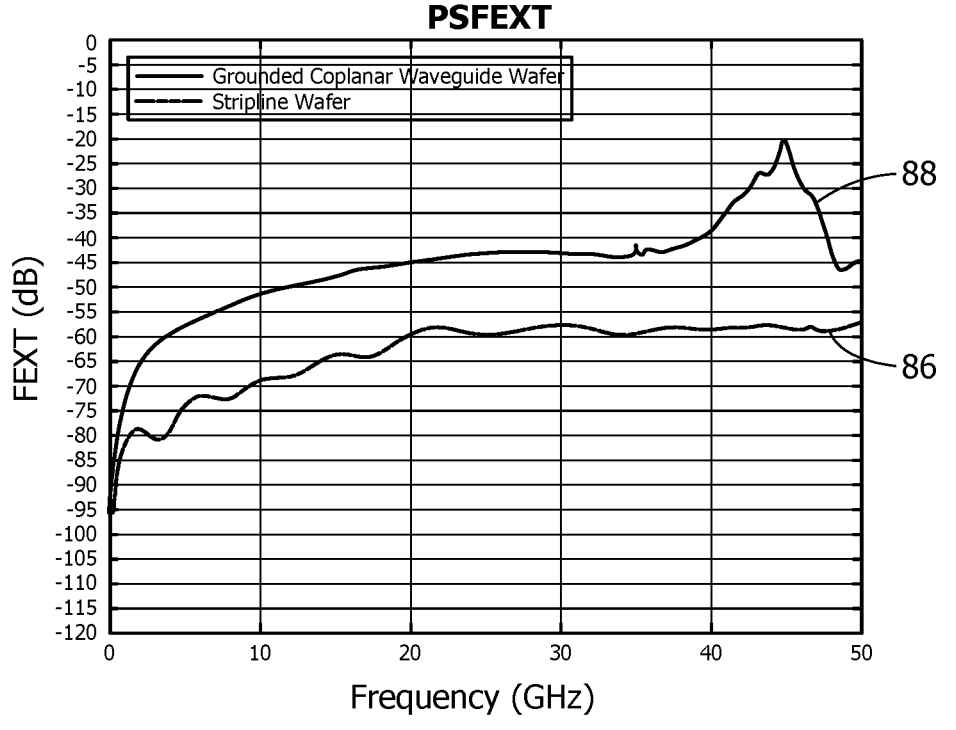
FIG. 10 is a graph illustrating the comparison between two simulated wafers with five signal pairs, the plot shows that the far end crosstalk (FEXT) is significantly lower in the stripline wafer of the present invention when compared to the grounded coplanar waveguide wafer of the prior art.

The stripline signal transmission lines, traces or pathways 32 are also significantly less susceptible to noise than the grounded coplanar waveguide wafers of the prior art. In very high-speed applications, noise is one of the main factors that degrade performance. Because the stripline signal transmission lines, traces or pathways 32 can be designed to be narrow, the stripline signal transmission lines, traces or pathways 32 can be spaced far enough apart from each other to practically eliminate electromagnetic coupling. This dramatically reduces near end crosstalk (NEXT) and far end crosstalk (FEXT). The stripline signal transmission lines, traces or pathways 32 is also highly immune to FEXT. The equation for FEXT can be seen below. In a stripline configuration, the mutual inductance and the inductance per unit length are the same and the mutual capacitance and capacitance per unit length are the same. This mean that, in the stripline configuration, the term in the parentheses will be zero. Therefore, in regions where the stripline signal transmission lines, traces or pathways 32 are coupled, there should be no FEXT. A comparison between two simulated wafers with five pairs is shown in FIG. 10. This graph shows that the FEXT is significantly lower in the stripline wafer 30, represented by plot 86, when compared to the known grounded coplanar waveguide wafer, represented by plot 88. The electromagnetic interference (EMI) is also reduced with a stripline configuration of the present invention as compared to the grounded coplanar waveguide wafers of the prior art.

$$FEXT = \frac{L}{T_\gamma} \frac{1}{2v} \left( \frac{C_m}{C} - \frac{Lm}{L} \right)$$

where,
L=coupling length
$T_r$=Rise time of the signal.
v=Speed of the signal in the medium
$C_m$=Mutual capacitance per unit length
C=Capacitance per unit length of the traces
L=Inductance per unit length
Lm=Mutual inductance per unit length between traces The multilayer stripline wafer 30 allows for versatility and different routing options to isolate the stripline signal transmission lines, traces or pathways 32 from each other. For example, in various embodiments, signals transmitted could be routed on one layer and signals received on another layer. In another embodiment, a ground plane could be placed in between layers to isolate them from each other. In another embodiment, multiple voltage planes could also be used within the same wafer, as shown in FIG. 8. For example, the first internal planar member 70 could be used for, but not limited to, 12 volts and the second internal planar member 72 could be used for, but not limited to, 24 volts. In another embodiment, the ground and power return could be designed on the same wafer. In another embodiment, three different voltage planes and three ground return planes may be provided on a six-layer wafer. In another illustrative embodiment, stripline signal transmission lines, traces or pathways may be routed on layer two and layers one and four could be used as a ground reference, allowing the stripline signal transmission lines, traces or pathways to be wider allowing the stripline signal transmission lines, traces or pathways to have less loss. Many other configurations of the wafers may be used. These are a few of the many applications the stripline wafer could be used in where none of these applications would be achievable with the grounded coplanar waveguide wafer.

Figure 9:
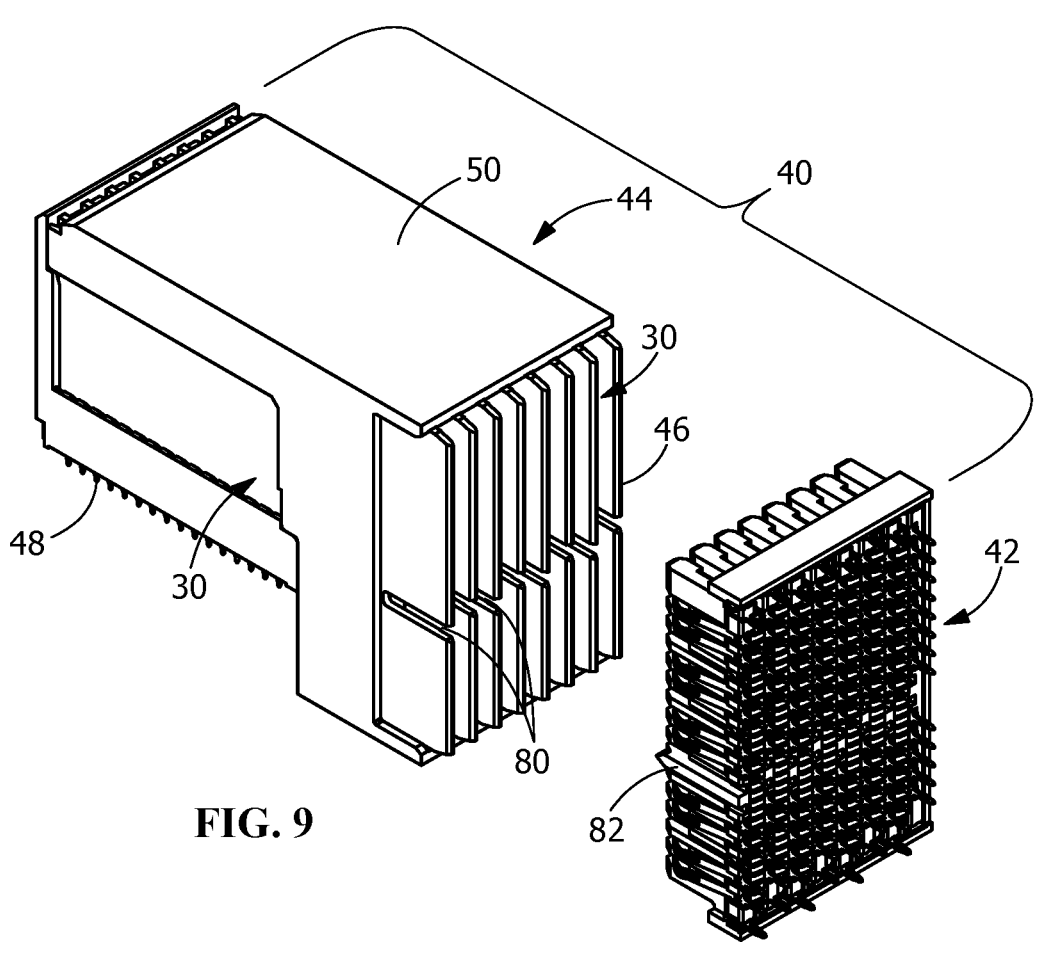
FIG. 9 is a perspective view of an illustrative electrical connector assembly with multiple wafers according to the present invention, the wafers having slots that engage with backplane connector housing keys to assure accurate contact to pad alignment and provide robust backplane housing.

The stripline wafer is thicker than the known grounded coplanar waveguide wafer, making the stripline wafer more durable. This allows for a slot 80 to be provided in the stripline wafer 30. The slot 80 extends from the mating interface 46, as shown in FIG. 9. The slot 80 is positioned in line and cooperates with a strength member or rib 82 provided in the backplane connector 42. The strength member 82 reinforces the backplane connector 42, allowing the backplane connector 42 to be more robust. When the daughtercard connector 44 is inserted onto the backplane connector 42, the strength member 82 is inserted into the slot 80. The strength member 82 cooperates with the slot 80 to proper position and align the daughtercard connector 44 with the backplane connector 42. The slot 80 and strength member 82 act as a key to ensure there is accurate alignment between the conductive pads 52 of the stripline wafer 30 of the daughtercard connector 44 and the signal contacts 20 in the backplane connector 42.

While the invention has been described with reference to a preferred embodiment, it will be understood by those skilled in the art that various changes may be made and equivalents may be substituted for elements thereof without departing from the spirit and scope of the invention as defined in the accompanying claims. One skilled in the art will appreciate that the invention may be used with many modifications of structure, arrangement, proportions, sizes, materials and components and otherwise used in the practice of the invention, which are particularly adapted to specific environments and operative requirements without departing from the principles of the present invention. The presently disclosed embodiments are therefore to be considered in all respects as illustrative and not restrictive, the scope of the invention being defined by the appended claims, and not limited to the foregoing description or embodiments.

What is claimed:

1. A multilayer stripline wafer for use in an electrical connector, the multilayer stripline wafer comprising:
   a mating interface and an mounting interface;
   multiple layers;
   signal transmission pathways positioned in at least one internal layer of the multiple layers, the signal transmission pathways having signal conductive pads positioned proximate but spaced from the mating interface;
   conductive planar members positioned in one or more layers of the multiple layers;
   floating pads extending between the mating interface and the signal conductive pads, the floating pads do not physically engaged the signal conductive pads, the floating pads being capacitively coupled to an internal ground layer of the multilayer stripline wafer and a beam area of a mating contact.

2. The multilayer stripline wafer as recited in claim 1, wherein the signal transmission pathways are single ended signal transmission pathways.

3. The multilayer stripline wafer as recited in claim 1, wherein the signal transmission pathways are coupled signal transmission pathways.

4. The multilayer stripline wafer as recited in claim 1, wherein the multilayer stripline wafer is a printed circuit board.

5. The multilayer stripline wafer as recited in claim 1, wherein a first ground plane member extends over a first surface of the wafer.

6. The multilayer stripline wafer as recited in claim 5, wherein openings are provided in the first ground plane member to expose the signal conductive pads.

7. The multilayer stripline wafer as recited in claim 1, wherein a second ground plane member is positioned in a layer of the one or more layers which is positioned proximate to the floating pads.

8. The multilayer stripline wafer as recited in claim 1, wherein lengths of the signal transmission pathways are matched for skew compensation.

9. The multilayer stripline wafer as recited in claim 2, wherein the transmission pathways are narrow to allow for increased routing density.

10. The multilayer stripline wafer as recited in claim 1, wherein the multilayer stripline wafer has at least one internal conductive planar member.

11. The multilayer stripline wafer as recited in claim 10, wherein at least one of the internal conductive planar members is positioned in a beam receiving area of the multilayer stripline wafer.

12. The multilayer stripline wafer as recited in claim 10, wherein at least one of the internal conductive planar members is a ground planar member.

13. The multilayer stripline wafer as recited in claim 2, wherein the single ended signal transmission pathways are routed between two layers of the conductive planar members.

14. The multilayer stripline wafer as recited in claim 1, wherein a slot extends from the mating interface, a mating interface of the multilayer stripline wafer, the slot configured to interact with a strengthening member of a mating connector to provide accurate alignment between the multilayer stripline wafer and the mating connector.

15. The multilayer stripline wafer as recited in claim 1, wherein stitched ground vias follow the routing of the signal transmission lines, traces or pathways.

16. He multilayer stripline wafer as recited in claim 1, wherein the conductive planar members are ground plane members which act as heatsinks.

\* \* \* \* \*